United States Patent [19]
Davis et al.

[11] Patent Number: 5,382,928
[45] Date of Patent: Jan. 17, 1995

[54] RF FILTER HAVING COMPOSITE DIELECTRIC LAYER AND METHOD OF MANUFACTURE

[75] Inventors: Thomas F. Davis, Camp Hill; James F. Iannella, Harrisburg, both of Pa.

[73] Assignee: The Whitaker Corporation, Wilmington, Del.

[21] Appl. No.: 8,277

[22] Filed: Jan. 22, 1993

[51] Int. Cl.⁶ .............................................. H03H 7/01
[52] U.S. Cl. ..................... 333/182; 333/184; 29/592.1
[58] Field of Search ............... 333/181–185, 333/12; 361/320, 321; 29/600, 592.1

[56] References Cited

U.S. PATENT DOCUMENTS

| | | | |
|---|---|---|---|
| Re. 29,258 | 1/1975 | Fritz | 333/70 S |
| 2,843,541 | 5/1956 | Senderoff et al. | 204/131 |
| 3,613,033 | 10/1971 | Denes | 333/182 |
| 3,638,147 | 1/1972 | Denes | 333/182 |
| 3,743,978 | 7/1973 | Fritz | 333/182 |
| 3,789,263 | 1/1974 | Fritz et al. | 333/182 X |
| 4,555,745 | 11/1985 | Westermeir et al. | 361/320 |
| 4,584,074 | 4/1986 | Sterling et al. | 204/181.1 |
| 4,734,663 | 10/1986 | Focht | 333/182 |
| 4,791,391 | 12/1988 | Linnell et al. | 333/184 |
| 4,853,659 | 3/1988 | Kling | 333/184 |
| 4,853,827 | 8/1989 | Hernandez | 361/321 |
| 4,931,754 | 6/1990 | Moussie | 333/184 |

OTHER PUBLICATIONS

European Search Report (three pages), Apr. 15, 1994.

*Primary Examiner*—Seungsook Ham

[57] ABSTRACT

A distributed element filter member (10) comprises a semi-conductor member (12) having a composite dielectric layer (24) disposed on and secured to a first major surface (16) of the member (12), the layer (24) being comprised of a polymerized dielectric material made of either barium titanate or strontium titanate particles in various ranges of mixture; a conductive layer (34) is disposed on portions of the dielectric layer defining an outer ground conductor and an inner conductive layer (36) is disposed on a second major surface of the semi-conductor member defining a signal conductor. The polymer utilized may be selected from an aqueous solution containing acrylic styrene as a copolymer or a solid polyester dissolved in carbitol acetate, or a solid bisphenol A-based epoxy resin dissolved in butyl carbitol acetate with various mixtures of barium or strontium titanate utilized. A filter (12') embodiment includes three layers of polymerized material.

14 Claims, 10 Drawing Sheets

RF FILTER HAVING COMPOSITE DIELECTRIC LAYER AND METHOD OF MANUFACTURE

FIELD OF THE INVENTION

This invention relates to filter members for use in electrical connectors and the like, and to a method for making such filter members.

BACKGROUND OF THE INVENTION

Filter members frequently are used on terminals and in electrical connectors to reduce noise and particularly to reduce electromagnetic interference (EMI) and radio frequency interference (RFI). EMI is electromagnetic energy, either occurring naturally or man-made, and it causes undesirable responses, malfunctions, or complete failures in electrical equipment. It is often desirable, therefore, to use filtering devices to suppress any external EMI from entering equipment or to absorb or suppress any EMI from being generated by the equipment connected thereto.

U.S. Pat. No. Re. 29,258 discloses a filter element of the distributed element type having an inner tube of extruded ferrite material coated on the exterior surface with a ceramic layer of barium titanate. A layer of metal plating covers the inner surface of the ferrite sleeve and the outer surface of the barium titanate layer. Gaps are left in the metal plating on the outer surface to isolate ground and center pin electrodes. The method for making the filter sleeve of the above patent involves the electrophoretic deposition of a barium titanate layer from an organic solvent followed by a heating process. The barium titanate layer is then sintered to form the ceramic layer, that is, the layer heated or fired to drive off the solvent and form a solid material. This sintering process for barium titanate on ferrite tubes typically takes place at about 2300° Fahrenheit (1260° Centigrade) and often results in low yields owing to cracking of the ferrite or sintered dielectric layer, or both, or poor adhesion of the dielectric to the ferrite. U.S. Pat. No. 4,584,074 discloses the forming of a fired ceramic material following joint electrodeposition of resin and ceramic powder from a liquid medium, again using high temperatures.

It is desirable, therefore, to have a method whereby dielectric materials such as barium titanate, or the equivalent, may be disposed on ferrite tubes without having the problems associated with the sintering process.

Additionally, the barium titanate typically is dissolved in an organic solvent such as tetrahydrofuran. Some of the organic solvent and binder is usually included in the barium titanate layer during the electrophoretic process. The solvent and binder are then burned off during the sintering process. The sintering process must be carefully controlled to avoid cracking of the composite ceramic layer on the ferrite sleeves. It is desirable, therefore, to have a method for making filter members which does not use organic solvents that must be volatilized during the process of manufacturing the filter members. It is desirable to have a method for making filter devices that gives a high yield of product and is cost effective.

Accordingly, it is an object of the invention to provide a means for manufacturing filter members that is cost effective and requires a minimum number of manufacturing procedures. It is a further object to provide a method for making filter members that eliminates the use of volatile organic solvents. It is still a further object to provide a filter element that contains a composite dielectric coating and a structure capable of operating in a wide range of temperatures with a very substantial dielectric constant and insulation resistance, dielectric withstanding voltage and good adhesion to a ferrite sleeve.

It is a final object to provide a method of manufacture of filter elements having superior characteristics of performance without the need for expensive and costly manufacturing steps involving heat and low yield.

SUMMARY OF THE INVENTION

Accordingly, the present invention is directed to filter members and to a method of manufacturing such members that eliminates the problems and disadvantages of the prior art. The method embraces utilizing a conformal coating of a polymer containing particles that have the characteristics of barium or strontium titanate which can be applied to ferrite sleeves without the use of extensive heat, sintering, and the problems that attach to such process and manufacturing steps. The method comprises the steps of disposing a composite dielectric layer on the exterior surface of a ferrite sleeve having appropriate filtering characteristics, one embodiment embracing the use of a water soluble polymerized dielectric polymer and the other utilizing a mixture of polymer and titanate material with the deposition being allowed to dry to either remove water from the embodiment utilizing water or otherwise volatilize to a solid coating. With respect to the embodiment utilizing a water soluble polymerized dielectric poller, barium titanate is added to 10 to 40 percent by volume with the mixture electrophoretically deposited on the sleeve. With respect to other conformal coatings, mixtures of barium titanate ranging from 10 to 70 percent by weight of an epoxy or 40 to 60 by weight of a polyester are coated on the filter sleeves.

After drying either to remove excess water or to volatilize the polymers, a plating resist is applied at selected locations along the polymer coated surface and the sleeve member is plated on the inner and outer surfaces with the resist providing isolation between ground and signal conductors of the sleeve. In an alternative embodiment utilizing multiple layers of the composite polymer to obtain higher dielectric values and improve isolation and insertion loss, layers of loaded polymer are sequentially applied with layers or traces of conductive material therebetween with the layers made to increase the effective area of the capacitor represented by the loaded conformal coating. A suitable plating buildup on the ferrite sleeve is accomplished utilizing well known plating techniques, the resist isolating signal and ground circuits on the inside and outside of the sleeve to effectively insert the filter structure, the inductance of the ferrite, and the capacitance of the loaded conformal coating between signal and ground circuits with respect to a connector or printed circuit board or the like utilizing the filter to isolate devices carried by circuits connected to a connector or printed circuit board.

DETAILED DESCRIPTION OF THE INVENTION

Figure 1:
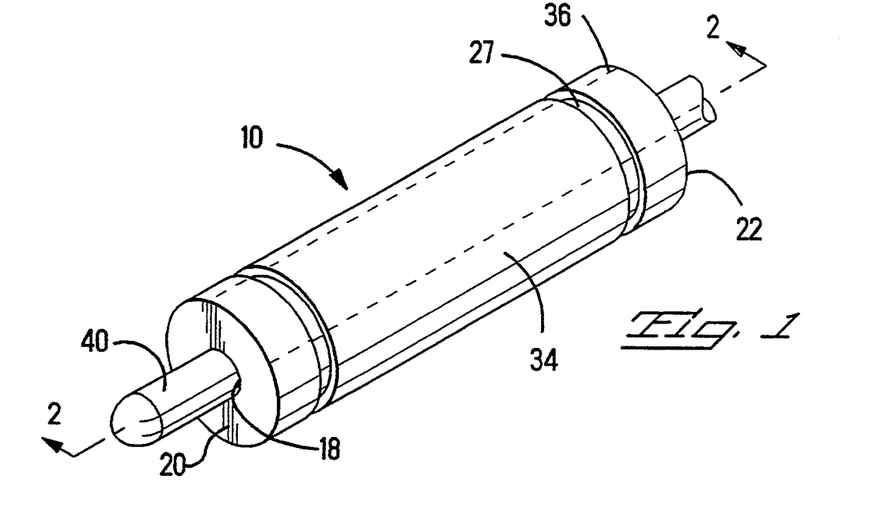
FIG. 1 is a perspective view of a filter sleeve member mounted onto an electrical terminal.
Figure 2:
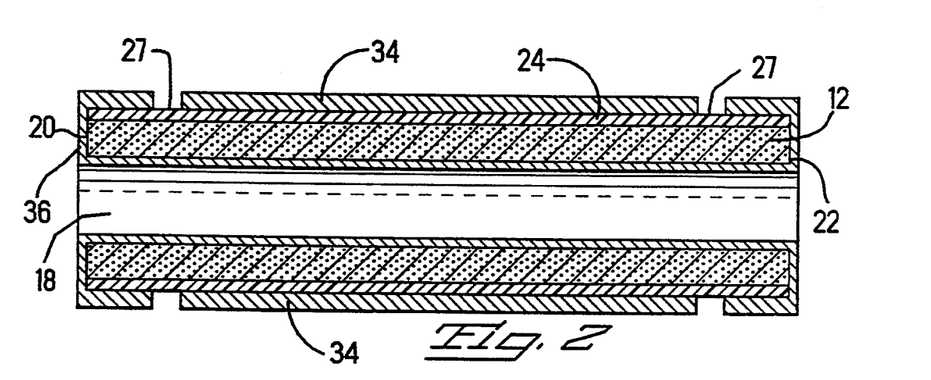
FIG. 2 is a longitudinal section view of the filter sleeve member taken along line 2—2 of FIG. 1.

Referring now to FIGS. 1 and 2, filter member 10 comprises a semi-conductive sleeve member 12, composite dielectric layer 24 disposed on the outer surface 16 of sleeve member 12 and isolated ground conductor 34 and terminal or signal conductor 36. The terms "composite dielectric layer" and "loaded conformal coating" are utilized in this application to describe dielectric layer 24, which is essentially a matrix comprised of polymer material and dielectric particles. For the purposes of illustrating the invention in one embodiment, the filter member is shown as a filter sleeve 10 having an aperture 18 extending therethrough for receiving a pin member 40 for providing filtering for signals carried by the conductive terminal or pin member 40 from a signal source to a device driven by the signal. It is to be understood that the filter member may have other configurations such as, for example, a configuration adaptable to be mounted on a printed circuit board.

Figure 3:
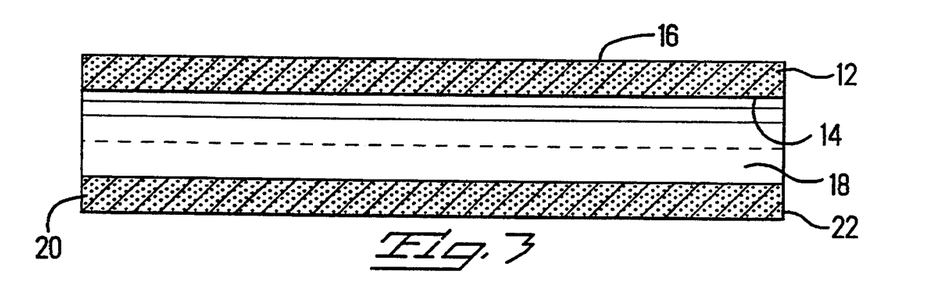
FIGS. 3 and 4 are similar to FIG. 2 and illustrate the steps in making the filter sleeve member of FIG. 1.
Figure 4:
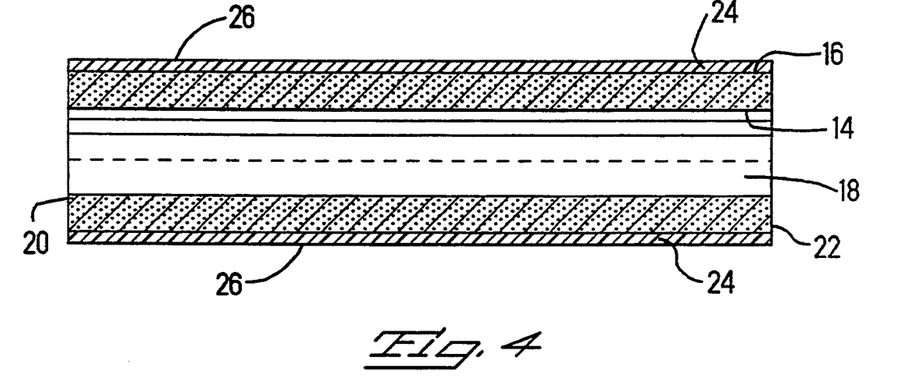

The structure of the filter member made in accordance with the invention in one embodiment can best be understood by referring to FIGS. 2 to 4. Member 12 comprises a sleeve having an inner surface 14 and an outer surface 16 with an aperture 18 extending longitudinally therethrough from the first end 20 to a second end 22, as best seen in FIG. 2. In the preferred embodiments of the invention, the semi-conductive sleeve member 12 is a ferrite material chosen to have filtering characteristics suitable for providing a reduction of unwanted signal components while allowing wanted signal components to be transmitted over pin member 40. A composite dielectric layer 24 is disposed on the outer surface 16 of sleeve member 12 as shown in FIG. 4. The deposited composite layer 24 is comprised of a dielectric polymeric material having in one embodiment from about 10 to 40 percent by volume of barium titanate particles dispersed therethrough. In this embodiment, the polymer is a water soluble acrylic styrene copolymer. An acrylic styrene copolymer is available from The Decatur Division, Whittaker Corporation, Decatur, Ala., under the trade name ELDEP Acrylic Enamel. Additional examples are given hereinafter, but in general the material selected for the polymeric base should be one that is compatible with and adheres to the ferrite sleeve material and has a high dielectric withstanding voltage, preferably one that exceeds 100 volts per centimeter. It should have an insulation resistance exceeding $10^{14}$ ohms per centimeter. Generally, the filter sleeve menders are soldered to a terminal contact pin and the polymer selected therefore, should form a composite layer that remains stable during the soldering process, which typically exposes the filter members to temperatures of about 190° to 290° Centigrade for a brief period of time.

In one preferred embodiment, the composite dielectric polymeric-barium titanate layer is electrophoretically deposited on the outer surfaces of ferrite sleeve 12. The thickness of the composite layer is preferably in the range of 0.0004 to 0.004 inch (0.01–0.1 mm). In accordance with the invention, the polymeric material remains, along with the barium titanate, on the outside of the sleeve and is simply dried with modest heat and does not have to be vaporized by high temperature. The presence of the barium titanate throughout the layer has been discovered to provide sufficient dielectric properties to achieve filtering in the range of 3000 picofarads/square inch (465 picofarads/square centimeter). The percentage of barium titanate considerably less than that required for sintering the barium titanate to form a ceramic layer as required by prior art filter members in the aforementioned patents. The present invention, therefore, provides a method where cost and yield problems associated with sintering are avoided. After deposition of the composite layer, the sleeve is passed through an oven to drive off any remaining water prior to the application of plating resist. To eliminate organic solvents, the polymer used for the dielectric composite 24 is in this embodiment, preferably water soluble, as mentioned.

The percentage of barium titanate may be varied according to the characteristics desired of the finished filter member. It is generally desirable that the capacitance of the filter have a minimum value greater than 100 picofarads per square centimeter and more preferably greater than 200 picofarads per square centimeter. Additionally it is preferred that the filter have an insulation resistance greater than $1 \times 10^9$ ohms per centimeter at 50 volts DC with a dielectric withstanding voltage greater than 200 volts DC per centimeter. A higher percentage of barium titanate will increase the dielectric constant of the composite. In a preferred embodiment, the size of barium titanate particles were on the order of 0.5–2.5 microns. Suitable barium titanate particles are readily available from a number of commercial sources. One material used to make sleeves in accordance with the invention is TAMTRON Z5U 652H available from Tam Ceramics, Inc., Niagara Falls, N.Y.

Figure 5:
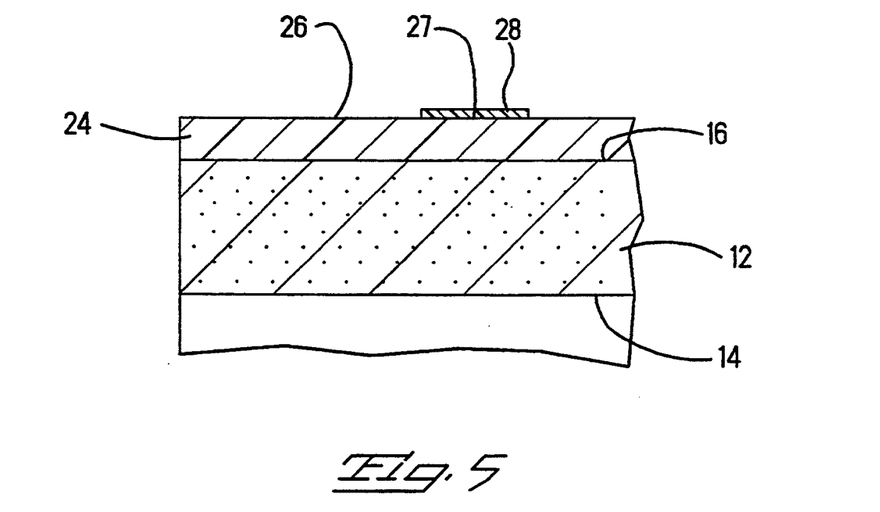
FIGS. 5 to 7 are enlarged fragmentary sections of the filter member of FIG. 1 illustrating further details of the process for making the member in accordance with one embodiment of the invention.
Figure 6:
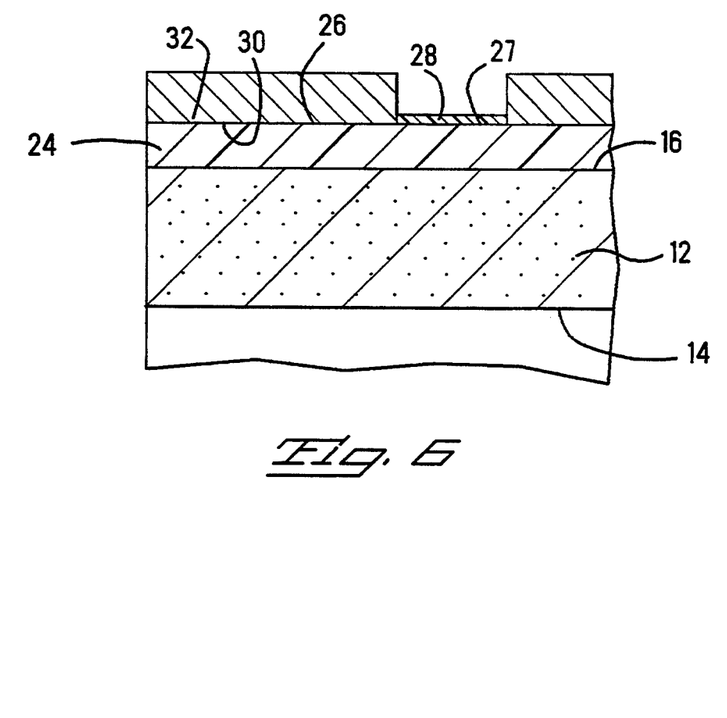
Figure 7:
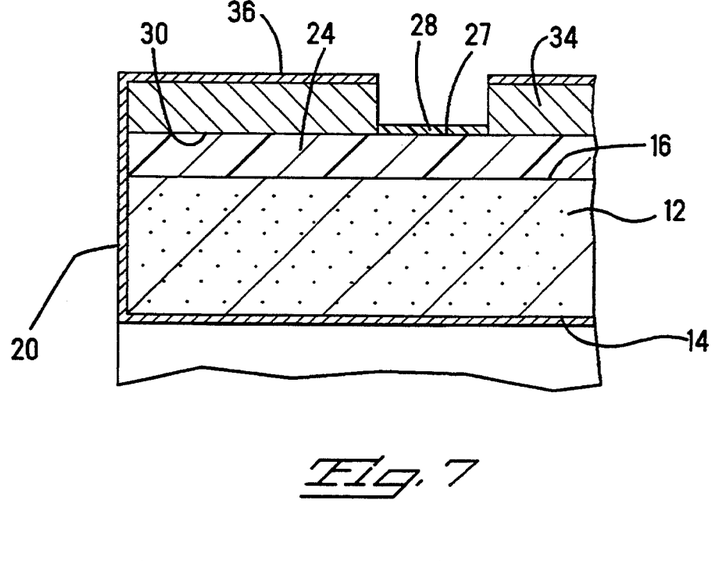

After a suitable thickness of dielectric composite layer 24 has been disposed on the outer surface of sleeve 12, the ground and signal conductors are plated in selected locations. The enlarged fragmentary sleeve portion shown in FIGS. 5 to 7 illustrate the preferred process for plating the conductors. A plating resist 28, as best seen in FIG. 5, is placed on selected areas 27 of outer surface 26 of layer 24 to provide a gap between the ground and terminal conductors, 34, 36. U.S. Pat. No. 4,734,663 discloses a method for providing banding or plating resist. To enhance the adherence of a plating layer on the dielectric composite 24, it is preferable to coat the outer surface 26 of layer 24 with a layer 30 of conductive ink material, such as a silver based conductive ink- available from Mavidon Corporation, Palm City, Fla., under the trade name MAVIDON 220C. The thickness of the ink layer is on the order of 0.001 inch (0.025 mm). The ground and signal conductors 34, 36 are then plated on the sleeve by methods known in the art. As best seen in FIGS. 2 and 7, the signal conductor 36 extends along the inner surface 14 of sleeve 12 and the outer ends, 20, 22, and partially along the outer surface 26 of layer 24 to the edge of the plating resist 27. The ground conductor 34 extends on the outer surface 26 between the two portions of plating resist 28. Typically, the sleeves are plated with a layer of electrolessly deposited copper or nickel, followed by a layer of tin, silver, or gold in accordance with methods known in the art. The thickness of the combined plating layers is on the order of 100 to 200 micro inches (0.0025–0.0052 mm). It is to be understood that other metals can also be used for plating the sleeves.

As an alternative to the use of a composite dielectric layer based upon an aqueous solution of a water solution polymer having particles of barium titanate dispersed throughout, the invention contemplates the use of a nonaqueous solution comprised of combining barium titanate with either a polyester or an epoxy to various weight percentages and then coating such mixture onto the sleeves to form the coatings 24, in lieu of the previously given embodiment example.

Thus, with respect to the further embodiment employing a conformal coating of MAVIDON 350CC epoxy resin dissolved in the solvent Butyl Carbitol Acetate on the ferrite sleeves, various mixes ranging in weight from 10 to 70 percent barium titanate by weight to epoxy were employed with capacitances ranging from 472 picofarads to 514 picofarads, for different weight percentages and with insertion losses at 100 Mhz on the order of from 7.5 to 18.2 Db.

A polyester conformal coating used a MAVIDON T662 polyester resin dissolved in Carbitol Acetate forming the composite dielectric layer 24 utilized a range of barium titanate in a weight percentage from 40 to 60 percent, achieving a capacitance on/the order of 375 to 364 picofarads, with an insertion loss on the order of 15 dB at 100 Mhz. In both of the foregoing embodiments, the remaining method steps to provide a finished filter were similar to the example previously given with respect to the water soluble polymer, without the need to evaporate the water percentage utilized with such.

Additionally, an example of the non-aqueous polymer was developed utilizing strontium titanate and the MAVIDON 350CC polymer in a 50 percent by weight mixture of each of these ingredients. The resulting structure yielded a capacitance on the order of 525 picofarads per 400 mills of coated ferrite sleeve and confirmed the practicality of mixing fine particles of materials such as barium titanate or strontium titanate in polymers without resort to high temperature processing steps, including sintering, for periods of time and minimizing the volatilization of undesirable chemicals.

Figure 8:
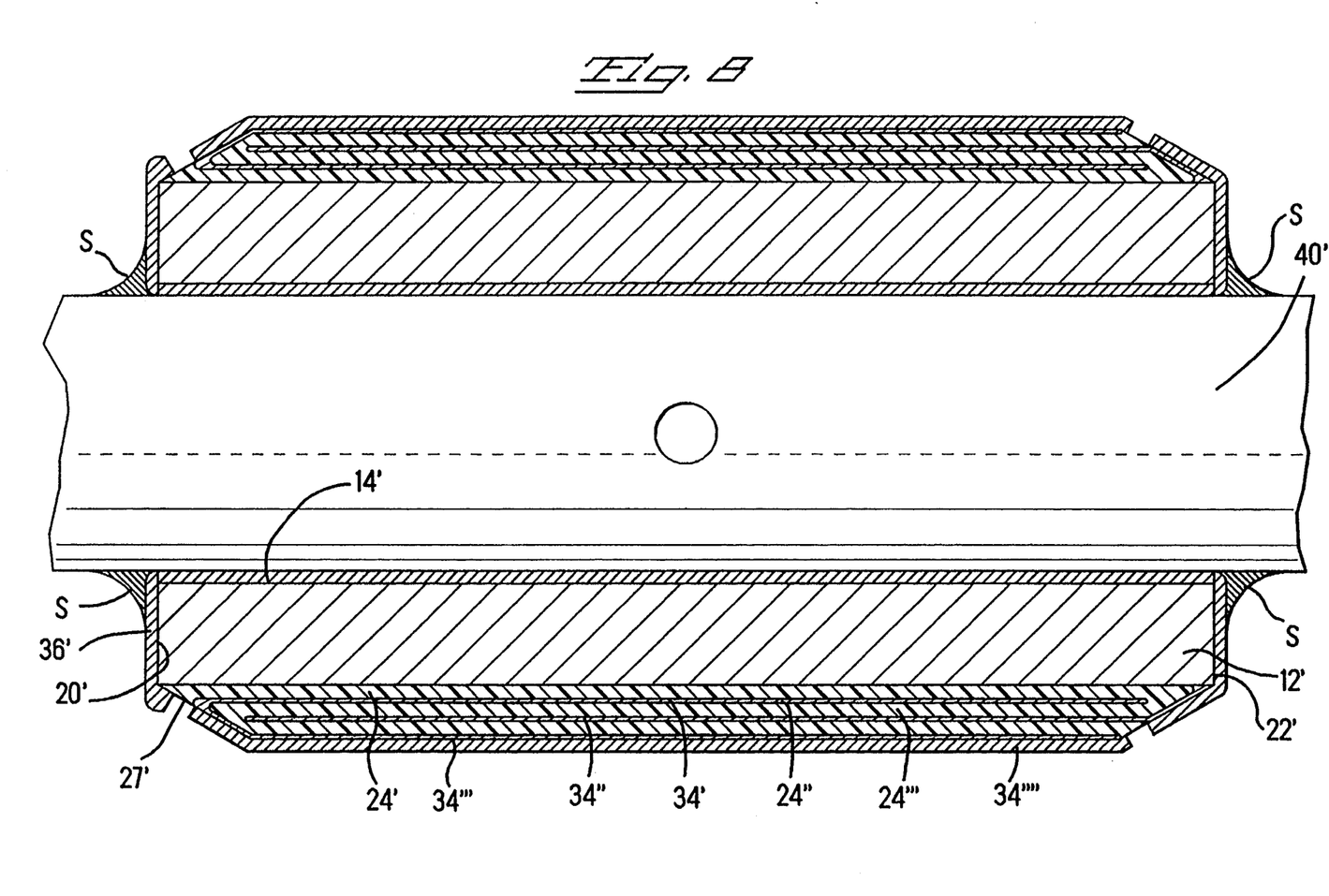
FIG. 8 is a longitudinal, sectional view of a filter in accordance with an alternative embodiment of the invention.

Work with the non-aqueous composite layers and the improvement in yield flowing from reduced numbers of processing steps and the loss of product due to fracture has led to the development of a multi-layered composite lamination with substantially improved performance and an associated improvement in the capacitance between ground and signal paths. Preferably the lamination has a capacitance greater than 400 picofarads per square inch and an insulation resistance greater than $1 \times 10^9$ ohms per centimeter at 50 volts DC and a dielectric withstanding voltage greater than 100 volts DC per centimeter. In FIG. 8, such a multi-layer composite or lamination is illustrated with the numerals heretofore utilized in describing the earlier embodiments as shown in FIGS. 1 to 7. Thus, referring to FIG. 8, the signal terminal pin 40 is shown with respect to a ferrite sleeve 12' having ends 20' and 22' and the composite layer thereover. With respect to the embodiment of FIG. 8, the multi-layer composite or lamination includes three layers, 24', 24'', and 24''' separated by conductive layers 34', 34'', and 34''' with an outside, heavier conductive coating 34''''. As can be seen, the outer layer 34'''' is separated electrically by the gap 27' from the ground conductive trace 36' that is joined to terminal pin 40' by being soldered thereto as at S. As can be observed, the various layers 24'–24''' are effectively between the ground circuit 34'''' and 36' to increase the area of the electrodes and dielectric material. In the embodiment shown in FIG. 8, the dielectric composite formed of polymer and barium titanate was on the order of 0.0005 to 0.004 inches with the electrodes 34' being on the order of 0.005 to 0.001 inches in thickness. The gaps 27' were suitably achieved through the use of a resist in the manner previously described.

Figure 9:
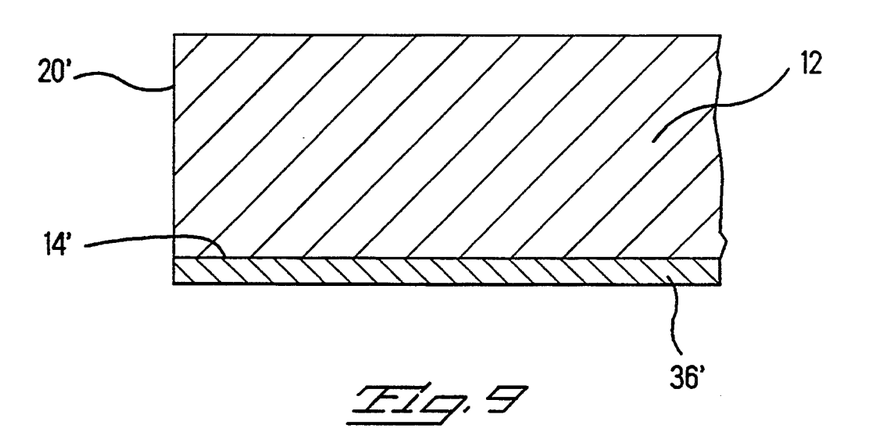
FIGS. 9 to 16 are enlarged sectional views of the end of a filter structure in accordance with the embodiment of FIG. 8 progressively showing the method of manufacture for such filter.
Figure 10:
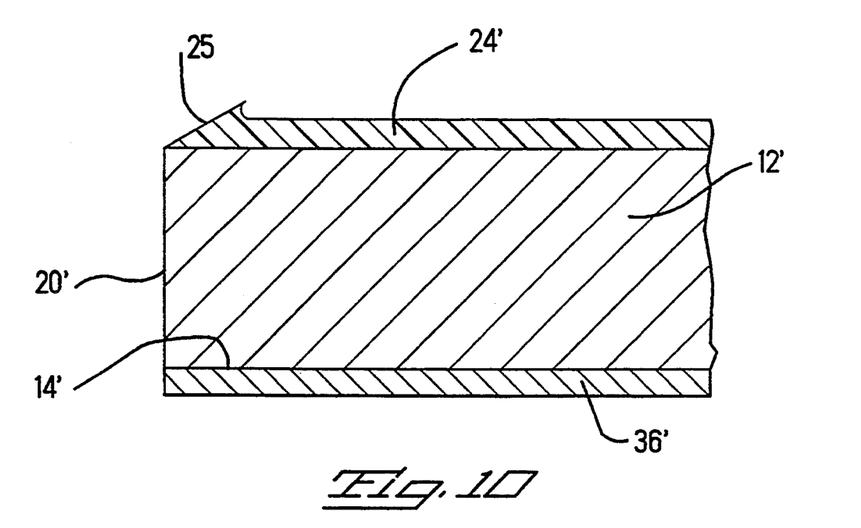

To visualize the formation of the structure shown in FIG. 8, reference is made to FIGS. 9 to 16. In FIG. 9, the inner or signal conductive layer 36' is shown relative to a ferrite 12' and an end 20' with the inner surface 14' of the sleeve also recognized in FIG. 9. In FIG. 10, the first coating of the polymer, composite material 24' is shown to include a slight beveled edge at 25 for purposes to become apparent.

Figure 11:
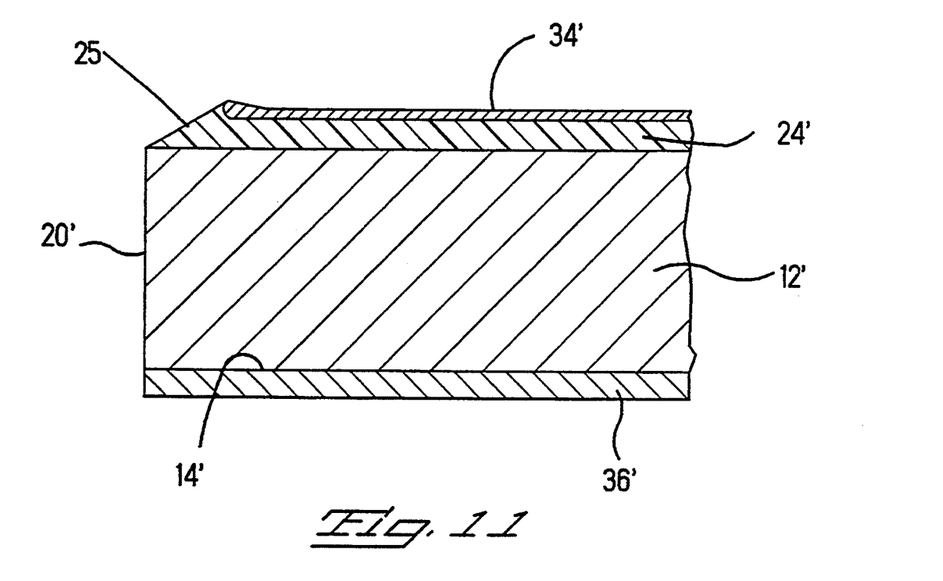
Figure 12:
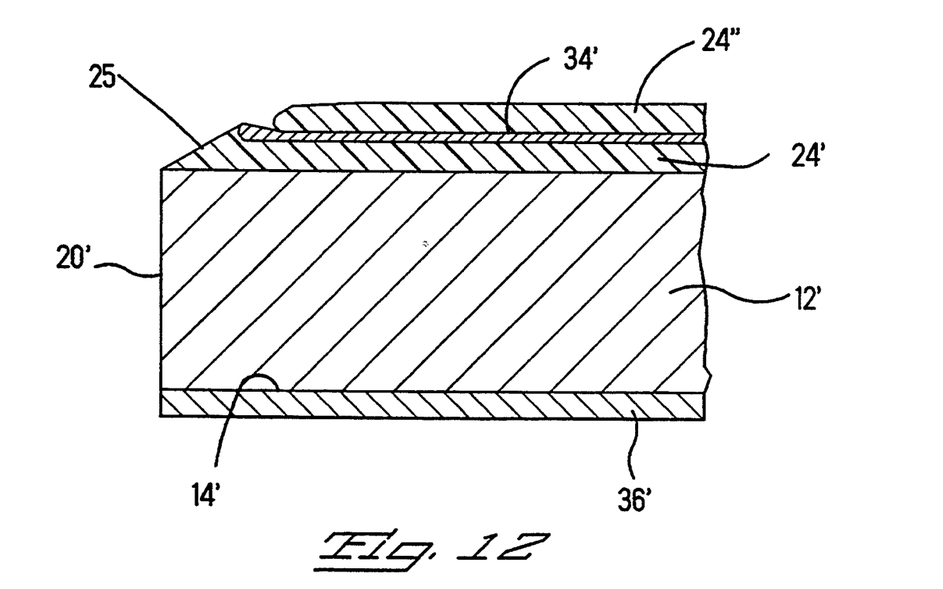

In FIG. 11, the conductive trace 34' is shown applied over 24' and in FIG. 12, a second dielectric layer 24'' is shown added to the structure, these layers being applied by coating the sleeve material.

Figure 13:
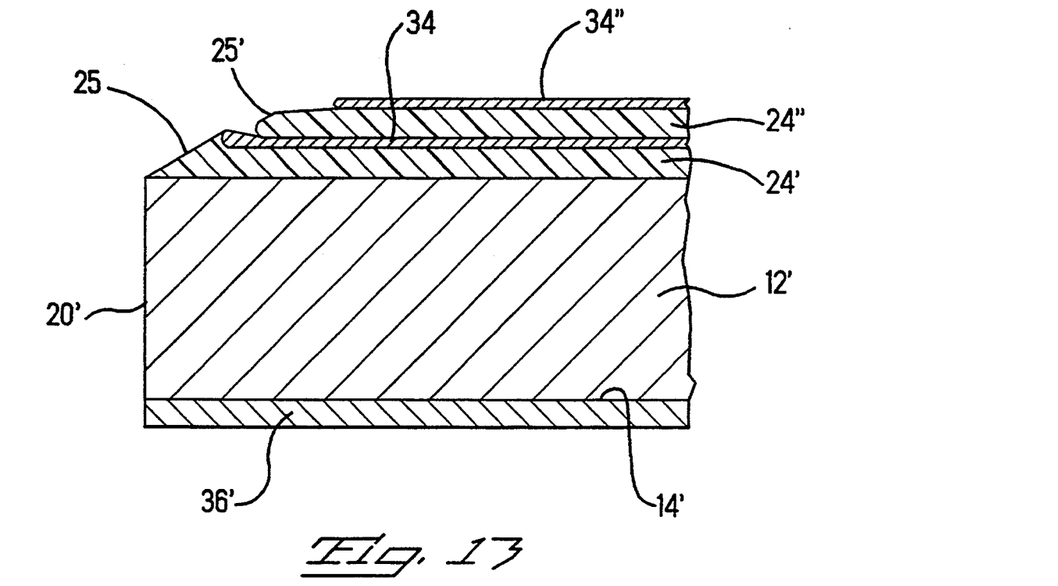
Figure 14:
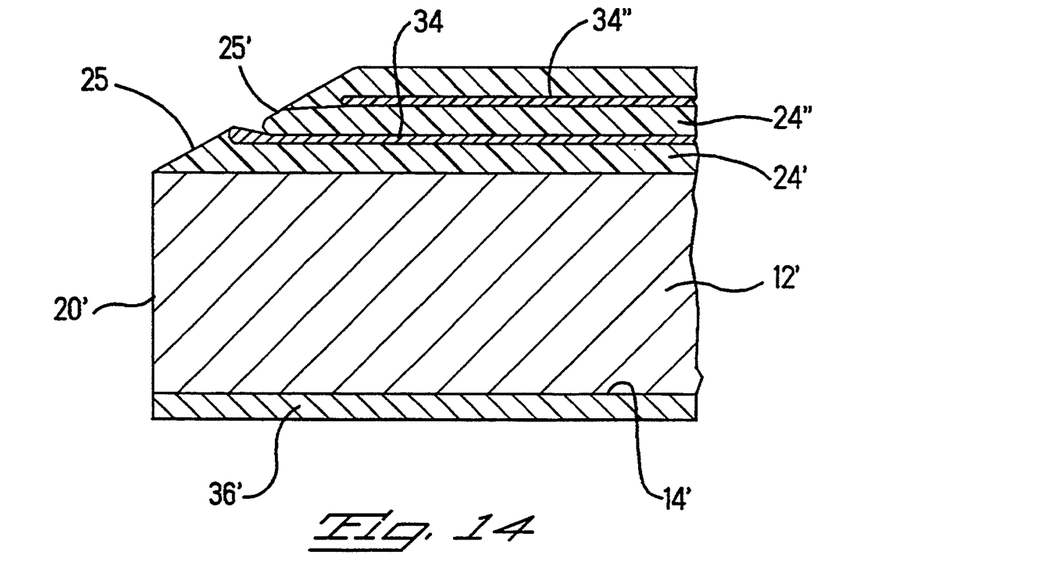
Figure 15:
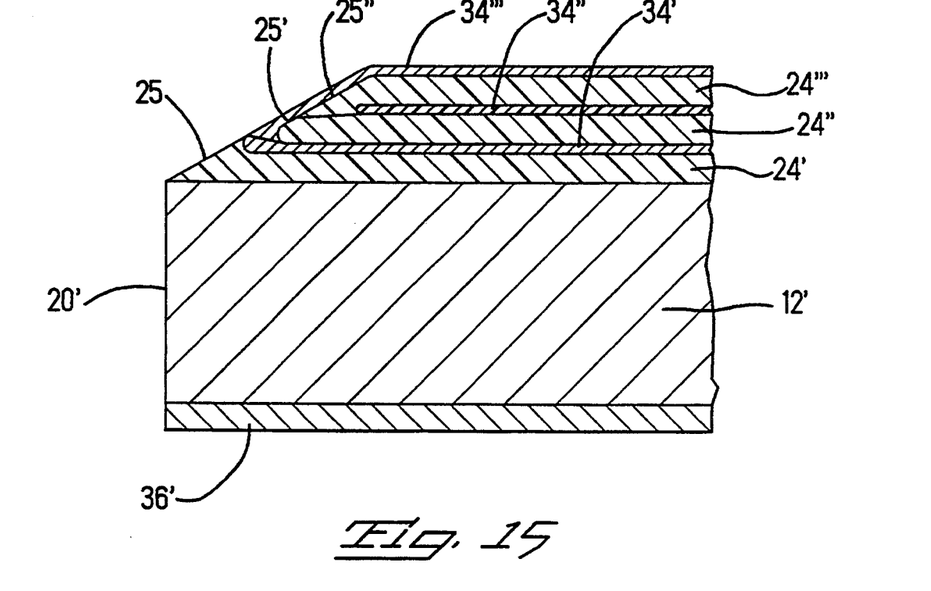
Figure 16:
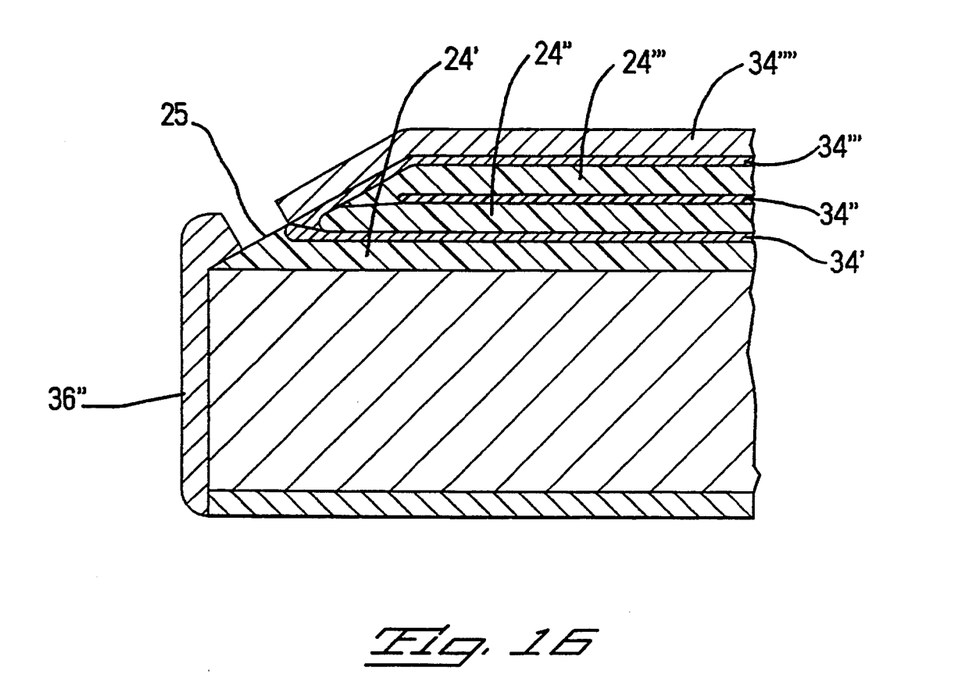

In FIG. 13, a second conductive layer 34'' is shown applied with the end of layer 24'' being maintained with a slight bevel as at 25'. FIG. 14 shows the addition of the third layer of dielectric composite material 24''' and the maintenance of the bevel 25''. FIGS. 15 and 16 show the subsequent steps leading to the final configuration of the filter with the addition of an end plating 36'' that joins 36' to serve as the signal structure for the filter. As can be discerned, the bevels 25, 25', and 25'' facilitate a tapering in that allows, in a practical method of manufacture, the separation of the dielectric composite layers 24'–24''' from the conductive layers 34'–34''' in the manner shown in FIG. 16.

As can be appreciated, the present invention provides for less handling of the filter members as they are being manufactured in that one or more steps may be performed on continuous lengths of tubular material prior to the tube being cut into desired lengths. More specifically, the composite polymeric material can be disposed along a length of ferrite material, and depending upon the method used, the ferrite material in the form of a sleeve may be cut before or after the resist material is applied. Since the plating layer must extend along the inner as well as the outer surface of the sleeves, it is necessary to cut the sleeves to length prior to the plating process but not necessarily prior to other coating process steps.

The process for formulating the coating mixtures and the test procedures are described in general and more specifically with respect to the examples given below. Composite coating mixtures were prepared by adding a selected amount of the polymer material and the dielectric powder to 200 ml of de-ionized water in a 500 ml plastic jar at room temperature with respect to the embodiment employing an aqueous mixture. The resulting mixture was continually stirred for a period of about 24 hours to assure even distribution of the polymer and powder in the water.

The resulting mixture was coated onto a ferrite rod, 15 cm long and 0.23 cm in diameter by electrophoresis, in a well understood manner. A 7.5 by 15 cm strip of stainless steel was placed in the jar to serve as a cathode, and the ferrite tube served as the anode for the process. The anode and cathode were connected to a Hewlett Packard Harrison 6902B meter calibrator set to provide a constant voltage. The electrophoretic process was run at 25 to 100 volts DC for about 1 to 45 seconds, during which time a coating was deposited evenly along the tubular member. Following deposition of the coating, the coated ferrite tube was baked in a 130° C. oven for 24 hours to remove the moisture. After baking, the composite coatings were about 0.025 to 0.075 mm thick, and the coated tube was then cut into 1 cm lengths before plating.

A layer of plating resist, as known in the art, was disposed on the desired exterior surfaces to separate the location for what were to become the ground and signal conductors. To provide surfaces to which subsequent plating would adhere, the composite coated tubes were then coated with a silver loaded ink to cover the exterior surfaces of the composite layer. The interior and exterior surfaces of the filter sleeves were then plated with a layer of electrolessly deposited copper, followed by a layer of electroplated silver.

With respect to the nonaqueous, conformal coated filters, mixtures of polymer and dielectric material were thoroughly mixed and coated on ferrite sleeves then dried with resist applied and plating.

Several tests were conducted on filter sleeve samples made in accordance with the foregoing process. Capacitance measurements were made by soldering sleeve samples to test pin terminals, which were then attached to a Hewlett Packard 4262A LCR (inductance, capacitance, resistance) meter, and the results were determined.

Insulation resistance measurements were performed on sample filter sleeves made in accordance with the invention. Each sleeve was placed on a test pin contact that was attached to a negative electrode. The positive electrode was attached to the ground electrode of the sleeve. Resistance was measured with a Hewlett Packard 4329A high resistance meter at 50 volts DC.

Dielectric withstanding voltage (DWV) testing was performed on sample filter sleeves made in accordance with the invention. Each sleeve was placed on a test pin contact that was attached to a negative electrode. The positive electrode was attached to the ground electrode of the sleeve. A voltage was applied. The voltage was increased slowly until either the dielectric core material (barium titanate or strontium titanate) broke down, as evidenced by an increased flow of current or breakage of the core, or electrically are between the ground and pin electrodes across the gap 27. The Hewlett Packard 4329A high resistance meter was used in this test as well.

Insertion losses were also determined for each sample. In order to measure signal attenuation by composite sleeve, signals of a known frequency and amplitude were supplied by RG-223 50 ohm coaxial cables by Rohde Schwarz SMG signal generator. The frequency and amplitude of the attenuated signal was compared to the input signal by a Hewlett Packard 8566 spectrum analyzer. The test was conducted with no load at 25° C.

Figure 17:
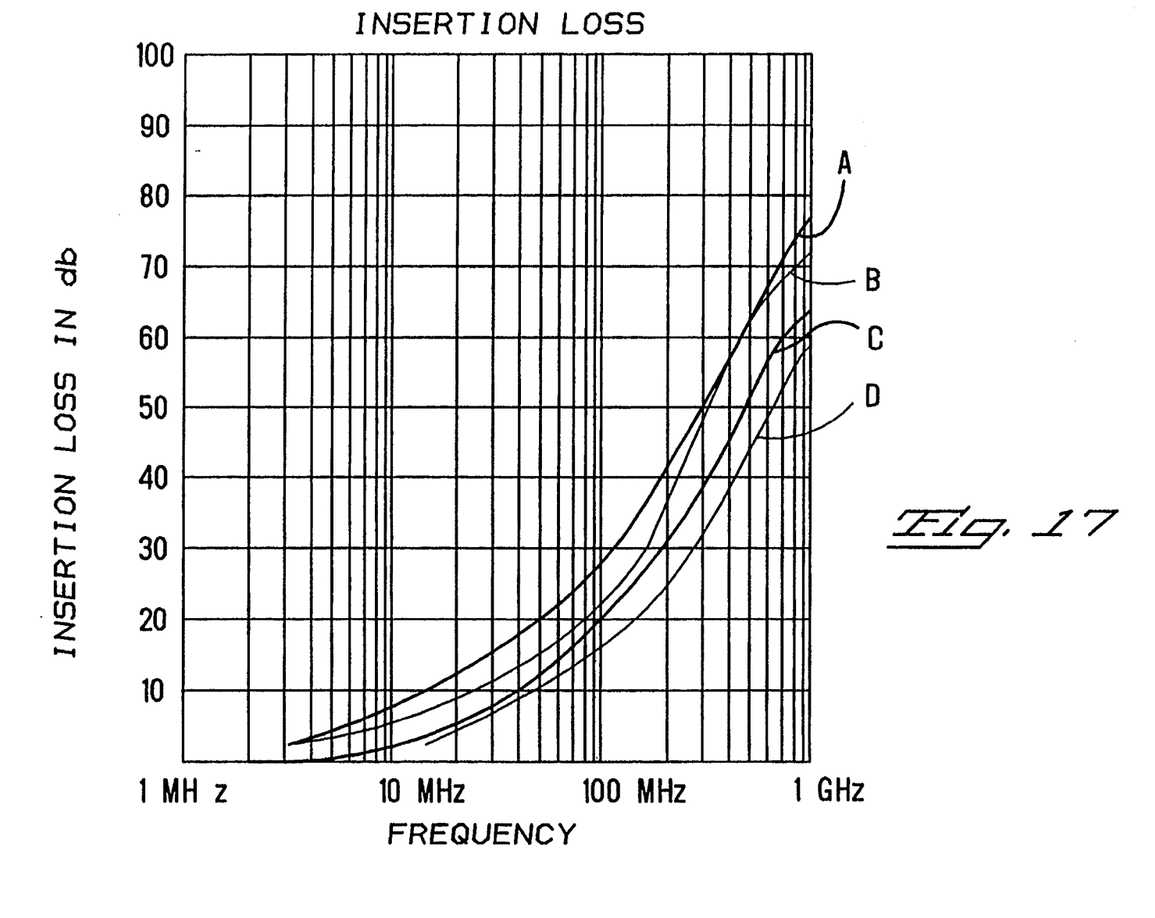
FIG. 17 is a graph comparing insertion loss of the various filters in accordance with the prior art and one embodiment of the invention relative to a range of signal frequencies.
Figure 18:
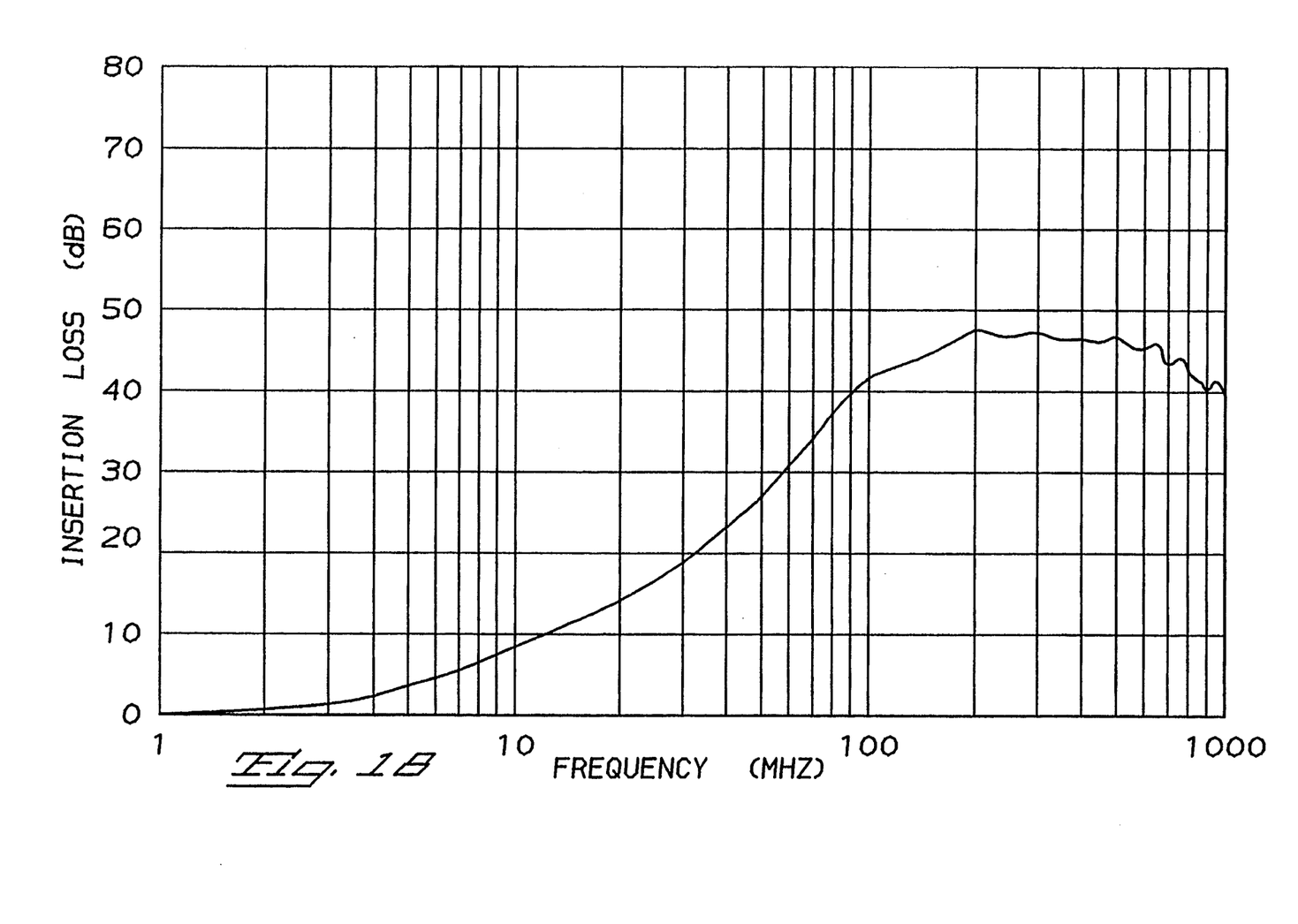
FIG. 18 is a graph similar to that of FIG. 17 but pertaining to the embodiment of the filter shown in FIG. 8.

A comparison of the insertion loss versus frequency for filter sleeves made in accordance with the invention and sleeves made in accordance with the prior art is shown in FIG. 17. The insertion loss curve for filter sleeves made in accordance with the invention with respect to samples utilizing a water soluble polymer is labeled C in FIG. 18, showing that the filter sleeves have an insertion loss on the order of 20 dB at 100 Mhz, quite adequate and comparable to the more expensive prior art filters. The curves labeled A, B, and D represent filter sleeves of the prior art, and these latter sleeves have insertion losses at 100 Mhz on the order of 28, 22, and 16 dB, respectively.

FIG. 18 shows insertion loss versus frequency for the triple-layered filter of FIG. 8 representing a barium titanate and polymer composite. There as can be seen, at 100 Mhz the insertion loss exceeds 40 dB, a considerably improved insertion loss with respect to the prior art and the water soluble polymer version of the present invention. The triple-sleeved filter is more demanding in manufacturing than the water soluble version or other versions that contain only a single layer, but without the need for sintering and the loss of yield attached to high temperatures due to cracking and other failures becomes an attractive choice for high performance filters.

Examples 1-5 below give preferred formulations for the dielectric composite layer used in forming the sleeves in accordance with the invention. The following examples illustrate the invention and ingredients expressed in parts by weight except where specifically otherwise indicated.

EXAMPLE 1

Using the procedures as described above, the following composite coating mixture was prepared:

| Component | Parts By Weight | Weight Used In Grams |
|---|---|---|
| Acrylic styrene copolymer[1] | 22.1 | 75.0 |
| Barium titanate powder[2] | 22.5 | 80.0 |
| Deionized water | 56.3 | 200.0 |
| | 99.9 | 355.0 |

[1]ELDEP acrylic enamel
[2]TAMTRON Z5U 652H

EXAMPLE 2

Using the same procedure as Example 1, the following composite coating mixture was prepared:

| Component | Parts By Weight | Weight Used In Grams |
|---|---|---|
| Acrylic styrene copolymer[1] | 17.2 | 75.0 |
| Barium titanate powder[2] | 36.8 | 160.0 |
| Deionized water | 46.0 | 200.0 |
| | 100.0 | 435.0 |

[1]ELDEP acrylic enamel
[2]TAMTRON Z5U 652H

EXAMPLE 3

Using the same procedure as Example 1, the following composite coating mixture was prepared:

| Component | Parts By Weight | Weight Used In Grams |
|---|---|---|
| Acrylic styrene copolymer[1] | 14.6 | 75.0 |
| Barium titanate powder[2] | 46.6 | 240.0 |
| Deionized water | 38.8 | 200.0 |
| | 100.0 | 515.0 |

[1]ELDEP acrylic enamel
[2]TAMTRON Z5U 652H

EXAMPLE 4

Utilizing the procedures relating to a dielectric composite employing barium titanate and epoxy, the following samples were prepared:

| Component | Parts By Weight | Weight Used In Grams |
|---|---|---|
| Epoxy[1] | 40.0 | 40.0 |
| Barium titanate powder[2] | 60.0 | 60.0 |
| | 100.0 | 100.0 |

[1]MAVIDON 350CC epoxy
[2]TAMTRON Z5U 652H

EXAMPLE 5

Using the previously mentioned polyester material, the following composite coating mixture was prepared:

| Component | Parts By Weight | Weight Used In Grams |
|---|---|---|
| Polyester[1] | 40.0 | 40.0 |
| Barium titanate powder[2] | 60.0 | 60.0 |
| | 100.0 | 100.0 |

[1]MAVIDON T662 Polyester
[2]TAMTRON Z5U 652H

In the foregoing examples, the choice of weight used in grams was arbitrary in the sense that an amount convenient for testing was compounded.

Filter sleeves having composite coatings in accordance with one of the above formulations were plated as previously described. A number of samples made from each formulation were tested in accordance with the described procedures, and the average results of tests performed on a plurality of samples of various composite coating formulations are given in Table 1, below:

TABLE 1

| Example No. | Average Capacitance (picofarads) | Insulation Resistance (giga ohms) | DWV Volts (DC) |
|---|---|---|---|
| 1 | 478 | >1 | >500 |
| 2 | 495 | >1 | >500 |
| 3 | 265 | >1 | >500 |
| 4 | 703 | >1 | >500 |
| 5 | 375 | >1 | >500 |

The invention filters utilizing the non-sintered polymeric material instead of a sintered material have been found to provide a better mechanical shock resistance than the harder ceramic material.

It is felt that the filter sleeves of the present invention and many of the attended advantages will be understood from the foregoing description. It will be apparent that various changes may be made in the form, construction and arrangement of the parts thereof, without departing from the spirit or scope of the invention or sacrificing its material advantages. The foregoing examples illustrate the invention. They are not to be construed as limitation on the invention except as indicated in the appended claims.

What is claimed is:

1. A distributed element filter member comprising:
    a semi-conductive member for receiving an electrical terminal therein, said member having opposed first and second major surfaces;
    a composite dielectric layer disposed on and secured to said first major surface and in intimate contact therewith, said layer being comprised of polymerized dielectric material mixed with particles selected from the group consisting of barium titanate and strontium titanate, said particles being present in the range of about 40 to 60 percent by weight and dispersed throughout said dielectric material to yield a layer having a capacitance for said filter greater than 200 picofarads per square centimeter and an insulation resistance greater than $1 \times 10^9$ ohms per centimeter at 50 volts DC with a dielectric withstanding voltage greater than 100 volts DC per centimeter;
    a conductive layer disposed on and secured to at least a portion of an outer surface of said composite dielectric layer, said conductive layer defining a ground conductor for said filter; and
    a further conductive layer disposed on and secured to at least a portion of said second major surface of said semi-conductive member, said further conductive layer defining a signal conductor adapted to be connected to said electrical terminal upon said terminal being received in said semi-conductive member of said filter, said signal conductor being isolated from said ground conductor; whereby
    upon disposing said terminal in said semi-conductive member of said filter and electrically connecting said terminal to said signal conductor of said filter and said ground conductor to ground, said filter provides filtering for electrical signals transmitted through said terminal.

2. The distributed element filter of claim 1 wherein said semi-conductive member is a ferrite sleeve.

3. The distributed element filter of claim 1 wherein said polymerized dielectric material in said composite dielectric layer is an acrylic styrene copolymer.

4. The distributed element filter of claim 1 wherein said polymerized dielectric material in said composite dielectric layer is comprised of a solid polyester-based resin.

5. The distributed element filter of claim 1 wherein said polymerized dielectric material in said composite dielectric layer is a solvent epoxy-based resin.

6. The distributed element filter of claim 1 wherein said ground conductor and said signal conductor are secured to said composite dielectric layer by an intermediate layer of conductive ink disposed between said composite dielectric layer and said ground and signal conductors thereon.

7. A distributed element filter comprising:
    a semi-conductive member for receiving an electrical terminal therein, said member having opposed first and second major surfaces;
    a lamination comprised of layers of conductive material with composite dielectric layers disposed between said conductive layers with said composite dielectric layers being comprised of a polymerized dielectric material having a percent of weight of particles in the range of about 40 to 60 percent selected from the group consisting of barium titanate and strontium titanate particles dispersed therein to yield a value of capacitance in excess of 400 picofarads per square centimeter for the lamination and an insulation resistance greater than $1 \times 10^9$ ohms per centimeter at 50 volts DC and a dielectric withstanding voltage greater than 100 volts DC;

a further conductive layer on at least a portion of an outer surface of said lamination, said further conductive layer defining a ground conductor for said filter;

another conductive layer on at least portion of said second major surface of said semi-conductor member, said another conductive layer defining a signal conductor adapted to be connected to an electrical terminal upon said terminal being received in said semi-conductor member of said filter.

8. A distributed element filter comprising:

a semi-conductive member for receiving an electrical terminal therein, said member having opposed first and second major surfaces;

a composite dielectric layer disclosed on and secured to said first major surface and in intimate contact therewith, said layer being comprised of a polymerized dielectric material selected from the group consisting of acrylic styrene copolymers, solid polyesters and solid bisphenol epoxy combined with particles selected from the group consisting of barium titanate and strontium titanate particles, said particles being present in the range of about 40 to 60 percent by weight and being dispersed throughout said layer sufficiently to yield a capacitance greater than 100 picofarads per square centimeter, an insulation resistance greater than $1 \times 10^9$ ohms per centimeter at 50 volts DC and a dielectric withstanding voltage greater than 100 volts DC per centimeter;

a conductive layer disposed on and secured to at least a portion of an outer surface of said composite dielectric layer, said conductive layer defining a ground conductor for said filter; and a further conductive layer disposed on and secured to at least a portion of said second major surface of said semi-conductor member, said further conductive layer defining a signal conductor adapted for connection to an electrical terminal upon said terminal being received in said semi-conductive member of said filter, said signal conductor being isolated from said ground conductor; whereby upon disposing said terminal in said semi-conductive member of said filter and electrically connecting said terminal member to said signal conductor of said filter and said ground conductor to ground, said filter provides filtering for electrical signals transmitted through said terminal.

9. The distributed element filter of claim 8 wherein said ground conductor and said signal conductors are secured to said composite dielectric layer by, a layer of conductive ink disposed between said composite dielectric layer and said ground and signal conductors.

10. A method for making a distributed element filter comprising the steps of:

selecting a semi-conductor member for receiving an electrical terminal therein, said member having opposed first and second major surfaces;

disposing a composite dielectric layer on said first major surface and in intimate contact therewith, said layer being comprised of a polymerized dielectric material and particles selected from the group consisting of barium titanate and strontium titanate particles, said particles being present in the range of about 40 to 60 percent by weight and dispersed throughout said polymerized dielectric material to yield a capacitance greater than 100 picofarads per square centimeter, an insulation resistance greater than $1 \times 10^9$ ohms per centimeter at 50 volts DC and a dielectric withstanding voltage greater than 100 volts DC per centimeter;

disposing a conductive layer on at least a portion of an outer surface of said composite dielectric layer, said conductive layer defining a ground conductor for said filter; and disposing a further conductive layer on at least a portion of said second major surface of said semiconductor member, said further conductive layer defining a signal conductor adapted for connection to an electrical terminal upon said terminal being received in said semi-conductive member of said filter, said signal conductor being isolated from said ground conductor.

11. The method of claim 10 wherein the step of disposing said composite dielectric layer includes selecting a polymer from the group consisting of acrylic styrenes, solid polyesters, and epoxys to be mixed with said titanate particles.

12. The method of claim 10 wherein said steps of disposing said conductive layer and disposing said further conductive layer includes an an intermediate step of disposing a conductive ink on said dielectric layer prior to disposing said conductive and further conductive layers thereon.

13. A distributed element filter sleeve comprising: a semi-conductive sleeve for receiving an electrical terminal therein, said sleeve having opposed first and second major surfaces;

a composite dielectric layer disposed on and secured to said first major surface and in intimate contact therewith, said layer being comprised of polymerized dielectric material mixed with a percentage in the range of about 40 to 60 percent by weight of particles selected from the group consisting of barium titanate and strontium titanate, dispersed throughout said dielectric material to yield a layer having a capacitance greater than 200 picofarads per square centimeter and an insulation resistance greater than $1 \times 10^9$ ohms per centimeter at 50 volts DC with a dielectric withstanding voltage greater than 100 volts DC per centimeter;

a conductive layer disposed on and secured to at least a portion of an outer surface of said composite dielectric layer said conductive layer being secured to said composite dielectric layer by an intermediate layer of conductive ink, said conductive layer defining a ground conductor for said filter; and a further conductive layer disposed on and secured to at least a portion of said second major surface of said semi-conductive sleeve, said further conductive layer being secured to said composite dielectric layer by an intermediate layer of conductive ink, said further conductive layer defining a signal conductor adapted to be connected to said electrical terminal upon said terminal being received in said semi-conductive of sleeve of said filter, said conductor being isolated from said ground conductor; whereby upon disposing said terminal in said semi-conductive sleeve of said filter and electrically connecting said terminal to said signal conductor of said filter and said ground conductor to ground, said filter provides filtering for electrical signals transmitted through said terminal.

14. The distributed element filter of claim 13 wherein said semi-conductive sleeve is a ferrite sleeve.

* * * * *